United States Patent
Chiu et al.

(10) Patent No.: US 8,058,915 B2
(45) Date of Patent: Nov. 15, 2011

(54) DIGITAL PHASE-LOCKED LOOP AND DIGITAL PHASE-FREQUENCY DETECTOR THEREOF

(75) Inventors: Huan-Ke Chiu, Hsinchu County (TW); Tzu-Chan Chueh, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 293 days.

(21) Appl. No.: 12/550,393

(22) Filed: Aug. 30, 2009

(65) Prior Publication Data

US 2010/0327912 A1 Dec. 30, 2010

(30) Foreign Application Priority Data

Jun. 29, 2009 (TW) ................................ 98121849 A

(51) Int. Cl.
*H03L 7/06* (2006.01)
*H03D 13/00* (2006.01)

(52) U.S. Cl. .................. 327/156; 327/3; 327/7; 327/12; 327/147; 327/150; 327/159; 331/1 R; 331/25; 331/1 A; 375/375; 375/376

(58) Field of Classification Search ................ 327/2, 3, 327/5, 7–10, 12, 147, 150, 156, 159; 331/1 R, 331/17, 18, 25, 1 A; 375/373–376
See application file for complete search history.

(56) References Cited

U.S. PATENT DOCUMENTS

| | | | |
|---|---|---|---|
| 6,851,493 B2 | 2/2005 | Staszewski et al. | |
| 7,095,259 B2 * | 8/2006 | Knotts | ............ 327/156 |
| 7,365,607 B2 | 4/2008 | Fahim | |
| 7,403,073 B2 | 7/2008 | Kossel et al. | |
| 7,551,707 B2 * | 6/2009 | Chiu et al. | ............ 377/47 |
| 2008/0218226 A1 | 9/2008 | Nagaraj | |
| 2008/0246545 A1 | 10/2008 | Rylyakov et al. | |
| 2008/0285704 A1 | 11/2008 | Chiu et al. | |
| 2008/0315921 A1 | 12/2008 | Cha et al. | |
| 2008/0315960 A1 | 12/2008 | Waheed et al. | |

OTHER PUBLICATIONS

Article Titled "A Low-Noise Wide-BW 3.6-GHz Digital Σ Fractional-N Frequency Synthesizer With a Noise-Shaping Time-to-Digital Converter and Quantization Noise Cancellation" authored by Chun-Ming Hsu et al., in IEEE JSSCCC, vol. 43, No. 12, 2008, pp. 2776-2786.

* cited by examiner

*Primary Examiner* — Patrick O'Neill
(74) *Attorney, Agent, or Firm* — Jianq Chyun IP Office

(57) ABSTRACT

A digital phase-locked loop and a digital phase-frequency detector thereof are provided. The digital PFD includes a divisor switch unit, a low-resolution phase-error detecting unit, an accumulating unit, a high-resolution phase-error detecting unit, a constant unit, and a selector. The divisor switch unit receives and removes partial pulses of a feedback signal for obtaining a feedback clock. The low-resolution phase-error detecting unit detects phase error between a reference signal and the feedback clock to obtain a phase-error pulse width. The accumulating unit accumulates the feedback signal during the phase-error pulse width for obtaining an output selection signal. The high-resolution phase-error detecting unit detects phase error between the reference signal and the feedback signal to obtain a phase-error value. The constant unit provides at least one constant value. The selector selects and outputs one of the phase-error value and the constant value according to the output selection signal.

23 Claims, 7 Drawing Sheets

DIGITAL PHASE-LOCKED LOOP AND DIGITAL PHASE-FREQUENCY DETECTOR THEREOF

CROSS-REFERENCE TO RELATED APPLICATION

This application claims the priority benefit of Taiwan application serial no. 98121849, filed Jun. 29, 2009. The entirety of the above-mentioned patent application is hereby incorporated by reference herein and made a part of specification.

BACKGROUND

1. Technical Field

The present invention generally relates to a phase-locked loop (PLL), and more particularly, to a digital PLL (DPLL) and a digital phase-frequency detector (DPFD) thereof.

2. Description of Related Art

With the rapid development of wireless communication, the digital phase-locked loop (DPLL) is one of important technologies in current years since it is easy to be realized in advanced system on chip. However, it is a challenge to design a DPLL having fast settling and low noise.

Currently, the DPLL faces two main issues: (1) after being digitalized, is the phase noise of the DPLL lower than that of a conventional phase-locked loop (PLL)? (2) does it provide wideband phase modulation or fast settling? Accordingly, it is a tradeoff between loop bandwidth and phase noise of the DPLL. For the DPLL, a larger loop bandwidth helps to reduce locking time and phase noise of the digitally controlled oscillator (DCO). Especially, when the DPLL is unlocked, if the loop bandwidth is timely exchanged, the locking time is reduced, such as U.S. Pat. No. 6,851,493 and U.S. patent publication No. 2008/0315960. These techniques necessarily depend on external apparatuses, so as to generate control signals to change the loop bandwidth.

Moreover, although the larger loop bandwidth helps to reduce locking time and phase noise of the DCO, a higher resolution digital phase-frequency detector (DPFD) is required to reduce in-band phase noise. For example, if the phase noise is lower than 100 dBc/Hz, the resolution of the DPFD is required up to 6 ps (picoseconds). Accordingly, the time required for being analyzed ranges from the pulse width of the reference frequency, such as 40 ns (nanoseconds), to 6 ps. However, if some apparatuses are added into the DPFD, the said issue is improved. As a result, when the DPLL is unlocked, the DPFD has lower resolution, but when the DPLL is locked, the resolution of the DPFD is highly raised, such as the paper "A low-noise wide-BW 3.6-GHz digital $\Delta\Sigma$ fractional-N frequency synthesizer with a noise-shaping time-to-digital converter and quantization noise cancellation" (*IEEE JSSCC*, vol. 43, no. 12, pp. 2776-2786, December 2008) published by C.-M. Hsu, M. Z. Straayer, and M. H. Perrott. However, the published technique is complex. The divisor of the divider, i.e. the divide scale thereof, is required to be changed to maintain a constant output frequency.

SUMMARY

An embodiment of the present invention provides a digital phase-frequency detector (DPFD) including a divisor switch unit, a low-resolution phase-error detecting unit, an accumulating unit, a high-resolution phase-error detecting unit, a constant unit, and a selector. The divisor switch unit receives a feedback signal and removes partial pulses of the feedback signal, so as to obtain a feedback clock. The low-resolution phase-error detecting unit is coupled to the divisor switch unit and detects a phase error between a reference signal and the feedback clock to obtain a phase-error pulse width. The accumulating unit is coupled to the low-resolution phase-error detecting unit and accumulates the feedback signal during the phase-error pulse width to obtain an output selection signal. The high-resolution phase-error detecting unit detects the phase error between the reference signal and the feedback signal to obtain a phase-error value. The constant unit provides at least one constant value. The selector is coupled to the accumulator unit, the high-resolution phase-error detecting unit, and the constant unit, and the selector selects and outputs one of the phase-error value and the at least one constant value according to the output selection signal.

An embodiment of the present invention provides a digital phase-locked loop (DPLL) including a digital phase-frequency detector (DPFD), a digital loop filter, a digitally controlled oscillator (DCO), a programmable integer frequency divider. The DPFD includes a divisor switch unit, a low-resolution phase-error detecting unit, an accumulating unit, a high-resolution phase-error detecting unit, a constant unit, and a first selector. The divisor switch unit receives a feedback signal and removes partial pulses of the feedback signal, so as to obtain a feedback clock; the low-resolution phase-error detecting unit is coupled to the divisor switch unit and detects a phase error between a reference signal and the feedback clock to obtain a phase-error pulse width. The accumulating unit is coupled to the low-resolution phase-error detecting unit and accumulates the feedback signal during the phase-error pulse width to obtain an output selection signal. The high-resolution phase-error detecting unit detects the phase error between the reference signal and the feedback signal to obtain a phase-error value. The constant unit provides at least one constant value. The first selector is coupled to the accumulator unit, the high-resolution phase-error detecting unit, and the constant unit, and the first selector selects and outputs one of the phase-error value and the at least one constant value according to the output selection signal. An input end of the digital loop filter receives an output of the first selector. The control end of the DCO is coupled to an output end of the digital loop filter. An output end of the DCO provides a phase-locked signal. An input end of the programmable integer frequency divider is coupled to the output end of the DCO, and an output end of the programmable integer frequency divider provides the feedback signal, wherein the programmable integer frequency divider is controlled by the feedback clock, so as to dynamically determine a divide scale thereof.

In view of the above, the embodiments of the present invention provide the DPLL and the DPFD thereof. When the DPFD is unlocked, a constant value having low resolution and large dynamic range serves as a phase error signal and is transmitted to the digital loop filter to shorten the locking time. When the DPFD is locked, the phase error signal is switched to be processed by the high-resolution phase-error detecting unit to reduce in-band phase noise. Accordingly, loop bandwidth is changed by using the output selection signal of the DPFD in the embodiments of the present invention, so that the DPFD having low power consumption, high resolution, and large dynamic range is formed.

To make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
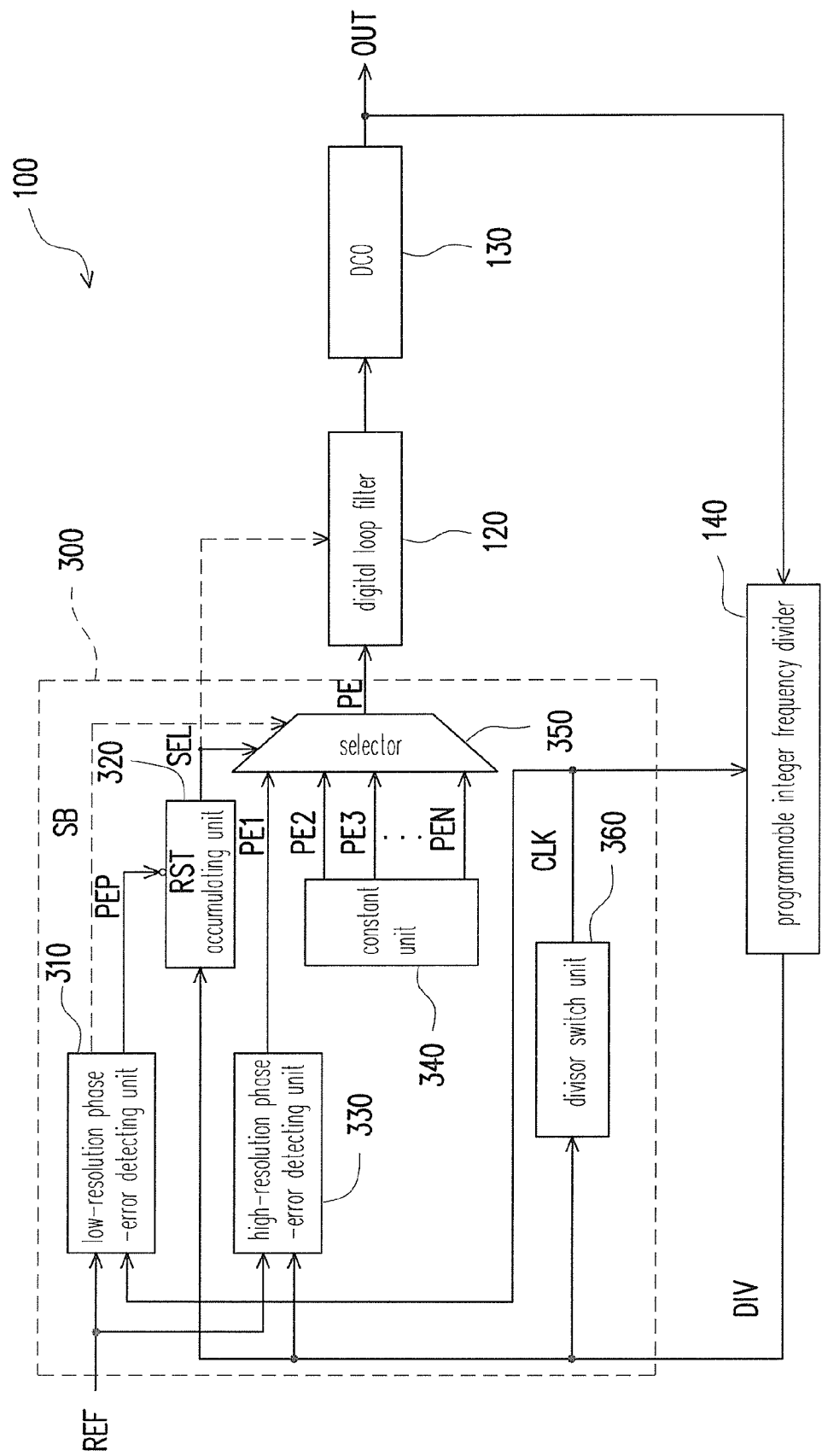
FIG. 1 is a block diagram of a digital phase-locked loop (DPLL) according to an embodiment of the present invention.

In order to design a digital phase-frequency detector (DPFD) having low power consumption, high resolution, and large dynamic range, a new configuration thereof is provided in the embodiment consistent with the present invention. FIG. 1 is a block diagram of a digital phase-locked loop (DPLL) according to an embodiment of the present invention. Referring to FIG. 1, the DPLL 100 includes a digital phase-frequency detector (DPFD) 300, a digital loop filter 120, a digitally controlled oscillator (DCO) 130, a programmable integer frequency divider 140. An input end of the programmable integer frequency divider 140 is coupled to an output end of the DCO 130, and the programmable integer frequency divider 140 frequently divides a phase-locked signal OUT outputted by the DCO 130. Moreover, an output end of the programmable integer frequency divider 140 provides a feedback signal DIV to the DPFD 300. The DPFD 300 receives a reference signal REF and detects a phase error between the reference signal REF and the feedback signal DIV Next, a phase-error signal PE is transmitted to the DCO 130 through the digital loop filter 120 thereby. A control end of the DCO 130 is coupled to an output end of the digital loop filter 120. According to an output of the digital loop filter 120, the DCO 130 correspondingly generates the phase-locked signal OUT. In the present embodiment, the DPFD 300 further generates a corresponding feedback clock CLK according to the feedback signal DIV, and the programmable integer frequency divider 140 is controlled by the feedback clock CLK and dynamically determines a divide scale, i.e. a divisor, thereof.

The said DPFD 300 includes a divisor switch unit 360, a low-resolution phase-error detecting unit 310, an accumulating unit 320, a high-resolution phase-error detecting unit 330, a constant unit 340, and a first selector 350. The divisor switch unit 360 receives the feedback signal DIV and removes partial pulses of the feedback signal DIV, so as to obtain the feedback clock CLK. For example, FIG. 2 illustrates waveforms of the reference signal REF, the feedback signal DIV, and the feedback clock CLK in FIG. 1 according to an embodiment of the present invention.

Figure 2:
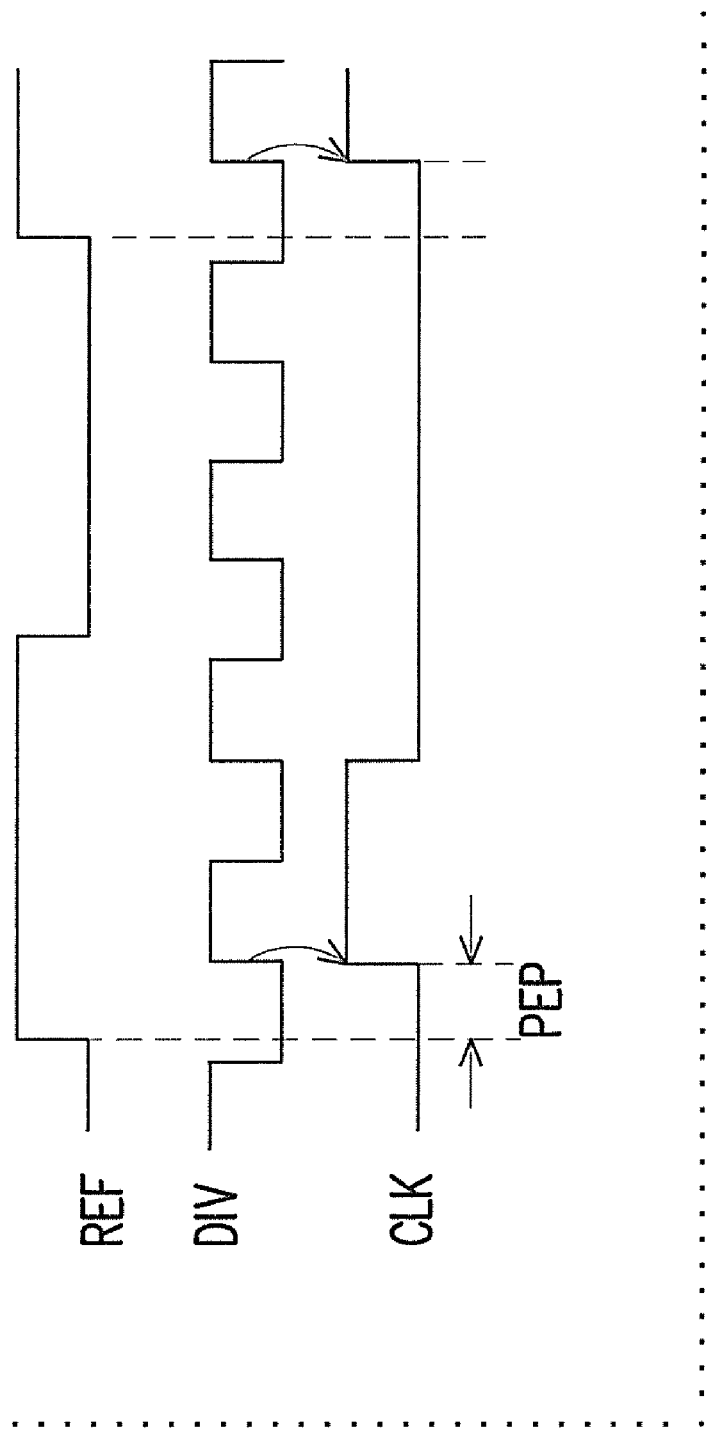
FIG. 2 illustrates waveforms of the reference signal REF, the feedback signal DIV, and the feedback clock CLK in FIG. 1 according to the embodiment of the present invention.

Referring to FIG. 1 and FIG. 2, every time after removing three continuous pulses of the feedback signal DIV, the divisor switch unit 360 passes one pulse thereof. Accordingly, the feedback clock CLK is generated to the low-resolution phase-error detecting unit 310 and the programmable integer frequency divider 140. In this case, dynamic-range of the high-resolution phase-error detecting unit 330 can be reduced by 12 dB, so that the difficulty of circuit design and power consumption of the circuit is reduced. The programmable integer frequency divider 140 dynamically determines the divide scale thereof according to the feedback clock CLK. For example, if the frequency of the phase-locked signal OUT is F, when the feedback clock CLK is at a high logic level, the programmable integer frequency divider 140 determines the divide scale thereof as A according to a divisor control end, so that the frequency of the feedback signal DIV is F/A. When the feedback clock CLK is at a low logic level, the divisor control end of the programmable integer frequency divider 140 fails, so that the circuit inside the programmable integer frequency divider 140 works while the lowest divide scale is B, so that the frequency of the feedback signal DIV is F/B. In this case, the divisor is F/B×0.75+F/A×0.25, and thus, a mean divide scale is obtained.

The low-resolution phase-error detecting unit 310 is coupled to the divisor switch unit 360. The low-resolution phase-error detecting unit 310 detects the phase error between the reference signal REF and the feedback clock CLK to obtain a phase-error pulse width PEP. In the present embodiment, the low-resolution phase-error detecting unit 310 further outputs a sign bit signal SB according to a result of the phase error between the reference signal REF and the feedback clock CLK. If the reference signal REF lags behind the feedback clock CLK, the low-resolution phase-error detecting unit 310 outputs the sign bit signal SB having the high logic level. On the contrary, if the reference signal REF leads the feedback clock CLK, the low-resolution phase-error detecting unit 310 outputs the sign bit signal SB having the low logic level. The accumulating unit 320 is coupled the low-resolution phase-error detecting unit 310. During the phase-error pulse width PEP, the accumulating unit 320 accumulates the feedback signal DIV to obtain an accumulated result as an output selection signal SEL. In another embodiment, the accumulating unit 320 may count the amount of rising edges or falling edges of the feedback signal DIV to obtain the output selection signal SEL during the phase-error pulse width PEP.

The high-resolution phase-error detecting unit 330 detects the phase error between the reference signal REF and the feedback signal DIV to obtain a phase-error value PE1. The high-resolution phase-error detecting unit 330 output the phase-error value PE1 to the first selector 350. The constant unit 340 provides at least one constant value. Herein, the constant unit 340 provides a plurality of constant values PE2, PF3, . . . , and PEN to the first selector 350. Alternatively, the constant unit 340 may be viewed as a low-resolution large-dynamic-range time-to-digital converter (TDC).

The first selector 350 is coupled the accumulating unit 320, the high-resolution phase-error detecting unit 330, and the constant unit 340. According to the output selection signal SEL, the first selector 350 selects one of the phase-error value PE1 and constant values PE2, PF3, . . . , and PEN as the phase-error signal PE. In the present embodiment, when the sign bit signal SB is at the high logic level, the first selector 350 completes the phase-error signal PE to represent a negative phase-error signal PE, and the first selector 350 outputs the completed phase-error signal PE (i.e. the complement of the phase-error signal PE) to the digital loop filter 120. When the sign bit signal SB is at the low logic level, an output value of the phase-error signal PE is unchanged to represent a positive phase-error signal PE and the first selector 350 outputs the phase-error signal PE to the digital loop filter 120. In another embodiment, the digital loop filter 120 may be controlled according to the output selection signal SEL and correspondingly adjusts the loop gain value thereof.

Figure 3:
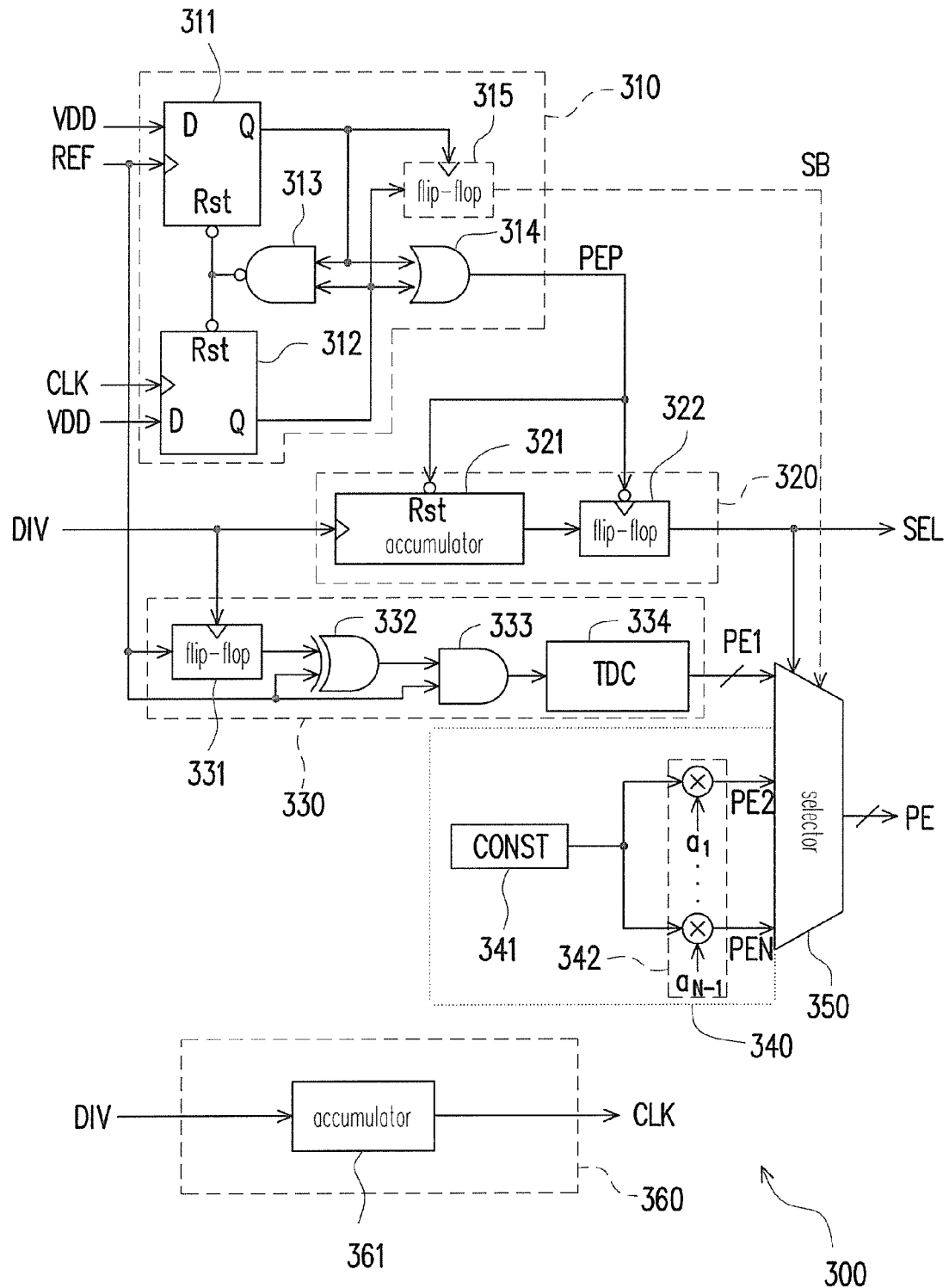
FIG. 3 is a schematic circuit diagram of the digital phase-frequency detector (DPFD) in FIG. 1 according to an embodiment of the present invention.

FIG. 3 is a schematic circuit diagram of the DPFD 300 in FIG. 1 according to an embodiment consistent with the present invention. Referring to FIG. 3, the divisor switch unit 360 is realized by an accumulator 361. The accumulator 361 has a predetermined initial accumulation value inside itself. A trigger end of the accumulator 361 is coupled to the output end of the programmable integer frequency divider 140 to obtain a pulse number of the feedback signal DIV When the accumulated result, i.e. the pulse number of the feedback signal DIV, achieves overflow, a carry end of the accumulator 361 outputs the high logic level, so that the carry end thereof can provides the feedback clock CLK. In the present embodiment, suppose that the accumulator 361 is 2-bit. When the predetermined initial accumulation value is set as 1, every time after removing three continuous pulses of the feedback signal DIV, the divisor switch unit 360 passes one pulse thereof. Accordingly, the feedback clock CLK is generated to the programmable integer frequency divider 140 and the low-resolution phase-error detecting unit 310. The divisor switch unit 360 is not limited to the configuration as shown in FIG. 3.

The low-resolution phase-error detecting unit includes a first flip-flop 311, a second flip-flop 312, a NAND gate 313, an OR gate 314, and a third flip-flop 315. A trigger end of the first flip-flop 311 receives the reference signal REF, and an input end of the first flip-flop 311 receives a first logic value. In the present embodiment, the first logic value is supposed as logic 1, and a system operating voltage VDD represents logic 1. A trigger end of the second flip-flop 312 receives the feedback clock CLK, and an input end thereof receives a first logic value, i.e. logic 1. A first input end of the NAND gate 313 is coupled to an output end of the first flip-flop 311, a second input end of the NAND gate 313 is coupled to an output end of the second flip-flop 312, and an output end of the NAND gate 313 is coupled to reset ends of the first flip-flop 311 and the second flip-flop 312. In this case, the reset ends of the first flip-flop 311 and the second flip-flop 312 are enabled by the low level. That is, when the reset ends are at the low level, the output ends "Q" of the first flip-flop 311 and the second flip-flop 312 are reset as logic 0. In other embodiments, if the reset ends of the first flip-flop 311 and the second flip-flop 312 are enabled by the high level, the NAND gate 313 may be changed to an AND gate.

A trigger end of the third flip-flop 315 is coupled to the output end of the first flip-flop 311, an input end of the third flip-flop 315 is coupled to the output end of the second flip-flop 312, and an output end of the third flip-flop outputs the sign bit signal SB. The said sign bit signal SB represents the phase of feedback clock CLK which is substantially equal to the phase of feedback signal DIV currently leads the phase of the reference signal REF or lags behind the phase of the reference signal REF. In other embodiments, the configurations realized by those of ordinary skill in the art are not limited to that shown in FIG. 3.

A first input end of the OR gate 314 is coupled to the output end of the first flip-flop 311, a second input end of the OR gate 314 is coupled to the output end of the second flip-flop 312, and an output end of the OR gate 313 provides the phase-error pulse width PEP to the accumulating unit 320. The accumulating unit includes a first accumulator 321 and a fourth flip-flop 322. A reset end of the first accumulator 321 is coupled to the output end of the OR gate 314 in the low-resolution phase-error detecting unit 310. In this case, the reset end of the first accumulator 321 is enabled by the low level. An input end or a trigger end of the first accumulator 321 is coupled to the output end of programmable integer frequency divider 140 to receive the feedback signal DIV. Accordingly, the first accumulator 321 may accumulate the feedback signal DIV or count the pulse number of the feedback signal DIV during the phase-error pulse width PEP. A trigger end of the fourth flip-flop 322 is coupled to the output end of the OR gate 314 in the low-resolution phase-error detecting unit 310. An input end of the fourth flip-flop 322 is coupled to an output end of the first accumulator 321. In this case, the trigger end of the fourth flip-flop 322 is "falling edge trigger", so that the fourth flip-flop 322 latches an output of the first accumulator 321 when the phase-error pulse width PEP ends, and the output end of the fourth flip-flop 322 further provides the output selection signal SEL of the accumulated result thereof to the first selector 350 and the digital loop filter 120.

The accumulating unit 320 is not limited to the configuration as shown in FIG. 3. For example, those of ordinary skill in the art may dispose a multiple frequency circuit (not shown) between the output end or the trigger end of the first accumulator 321 and the output end of the programmable integer frequency divider 140 as required. An input end of the multiple frequency circuit is coupled to the output end of the programmable integer frequency divider 140 to receive the feedback signal DIV, and an output end of the multiple frequency circuit is coupled to the output end or the trigger end of the first accumulator 321. Accordingly, after multiplying the frequency of the feedback signal DIV, the said multiple frequency circuit transmits the multiplied feedback signal DIV to the first accumulator 321.

The high-resolution phase-error detecting unit 330 is not limited to the configuration realized in the present embodiment. Those of ordinary skill in the DPLL technology may adopt any phase-error detecting unit to realize the high-resolution phase-error detecting unit 330 as required. Herein, FIG. 3 simply illustrates an exemplary embodiment of the high-resolution phase-error detecting unit 330. The high-resolution phase-error detecting unit 330 includes a flip-flop 331, an exclusive-OR (XOR) gate 332, an AND gate 333, and a time-to-digital converter (TDC) 334. A trigger end of the flip-flop 331 is coupled to the output end of the programmable integer frequency divider 140, an input end of the flip-flop 331 receives the reference signal REF. A first input end of the XOR gate 332 is coupled to an output end of the flip-flop 331, and a second input end of the XOR gate 332 receives the reference signal REF. A first input end of the AND gate 333 is coupled to an output end of the XOR gate 332, and a second input end of the AND gate 333 receives the reference signal REF. An output end of the AND gate 333 outputs the phase-error pulse width to represent the phase error between the reference signal REF and the feedback signal DIV.

An input end of the TDC 334 is coupled to an output end of the AND gate 333. The TDC 334 converts the phase-error pulse width PEP outputted by the AND gate 333 to the corresponding phase-error value PE1 (a digital code), and an output end thereof then provides the phase-error value PE1 to the first selector 350. Herein, the implementation of the TDC 334 is not limited. For example, a gated ring oscillator (GRO) may be used to detect the phase-error pulse width outputted by the AND gate 333 and then output the corresponding phase-error value PE1 inside the TDC 334.

Figure 4:
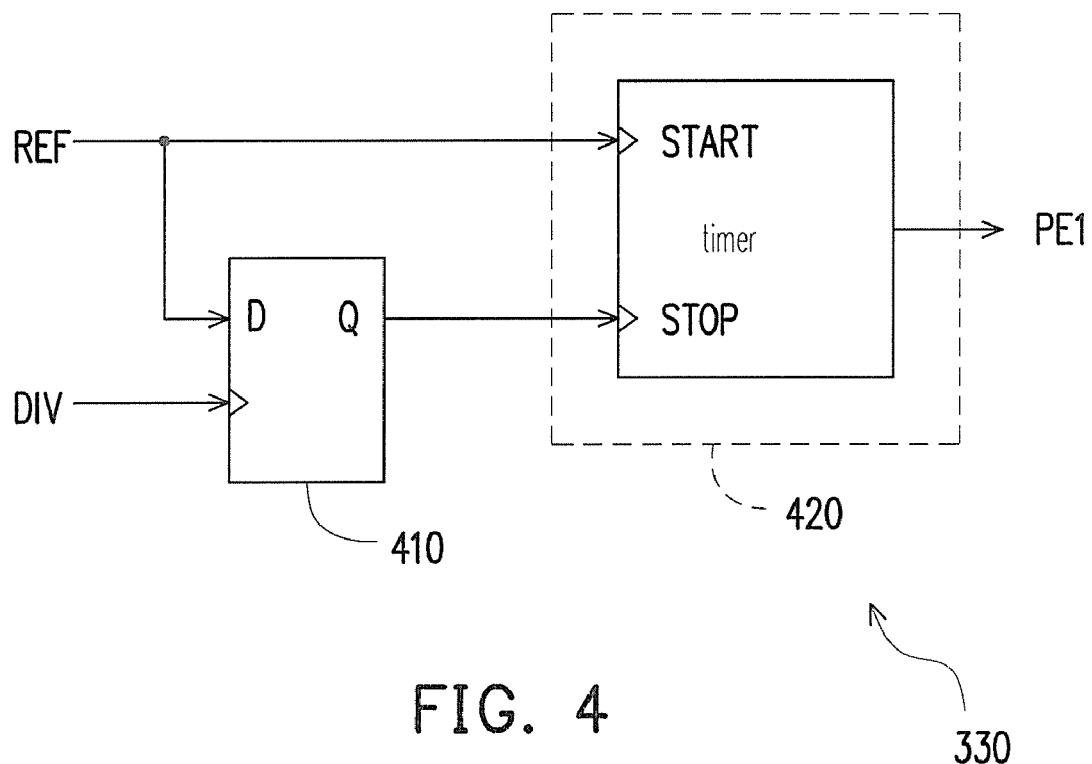
FIG. 4 illustrates another exemplary embodiment of the high-resolution phase-error detecting unit in FIG. 1 consistent with the present invention.

FIG. 4 illustrates another exemplary embodiment of the high-resolution phase-error detecting unit 330 in FIG. 1 consistent with the present invention. The high-resolution phase-error detecting unit 330 includes a fifth flip-flop 410 and a TDC 420. A trigger end of the fifth flip-flop 410 is coupled to the output end of programmable integer frequency divider 140 to receive the feedback signal DIV. An input end of the fifth flip-flop 410 receives the reference signal REF. A first input end of the TDC 420 receives the reference signal REF, a second input end thereof is coupled to an output end of the fifth flip-flop 410, and an output end of the TDC 420 provides the phase-error value PE1. In the present embodiment, a timer is used to detect the phase error between the reference signal REF and the feedback signal DIV inside the TDC 420, and the TDC 420 then outputs the phase-error value PE1. A start end START of the timer receives the reference signal REF. and a stop end STOP of the timer is coupled to the output end of the fifth flip-flop 410. When the rising edge of the pulse appears at the start end START, the timer starts to work until the rising edge of the pulse appears at the stop end STOP. Accordingly, the timer detects the phase error between the reference signal REF and the feedback signal DIV, and an output end of the timer then provides the phase-error value PE1.

Referring to FIG. 3, the constant unit 340 includes a register 341 and a first multiplier 342. Herein, the first multiplier 342 includes N−1 multipliers, wherein N is an integer larger than 1. A step value CONST, i.e. a constant value, is recorded inside the register 341, and the register 341 provides to the first multiplier 342. The first multiplier 342 is coupled to the register 341 and outputs the step value CONST as the constant value after multiplying the step value CONST by one or more multiples. In this case, after multiplying the step value CONST by a plurality of multiples $a_1$-$a_{N-1}$, the first multiplier 342 respectively outputs the constant values PE2-PEN to the first selector 350.

Figure 5:
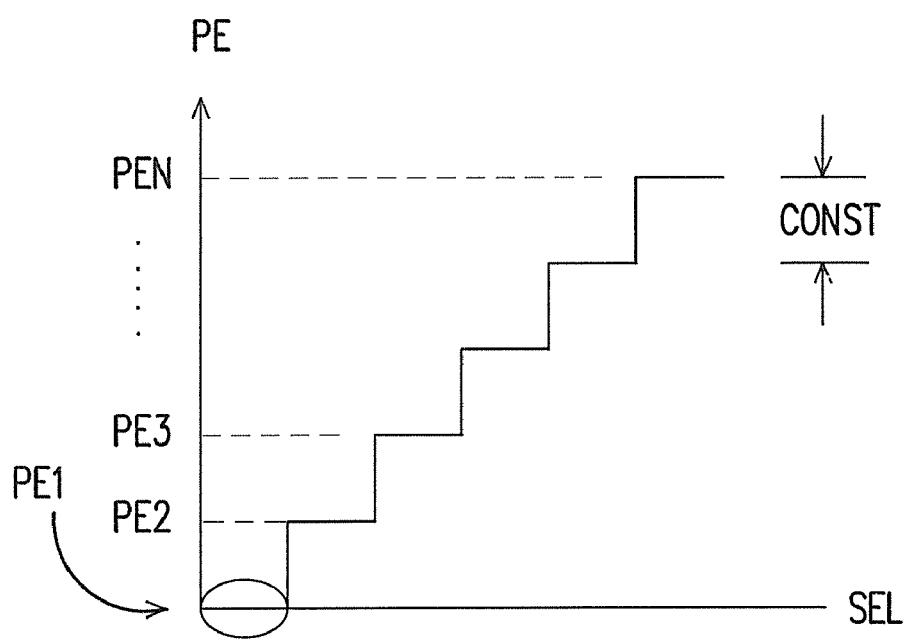
FIG. 5 is a schematic diagram of a relationship of the output selection signal SEL and the phase error signal PE in FIG. 1 and FIG. 3 according to an embodiment of the present invention.

According to the output selection signal SEL outputted by accumulating unit 320, the first selector 350 selects one of the phase-error value PE1 and the constant values PE2, PF3, . . . , and PEN as the phase-error signal PE. When the sign bit signal SB is at the high logic level, the first selector 350 completes the phase-error signal PE to represent the negative phase-error signal PE. When the sign bit signal SB is at the low logic level, an output value of the phase-error signal PE is unchanged to represent the positive phase-error signal PE, and the first selector 350 outputs the phase-error signal PE to the digital loop filter 120. FIG. 5 is a schematic diagram of a relationship of the output selection signal SEL and the phase error signal PE in FIG. 1 and FIG. 3 according to an embodiment consistent with the present invention. Referring to FIG. 3 and FIG. 5, if the phase error between the reference signal REF and the feedback clock CLK is small, e.g. the phase error between 10 ns and 5 ps, it means that the DPFD 300 requires high resolution. Accordingly, the output selection signal SEL controls the first selector 350 to select and output the phase-error value PE1 to the digital loop filter 120. If the phase error between the reference signal REF and the feedback clock CLK are larger, e.g. the phase error between 40 ns and 10 ns, it means that the DPFD 300 simply requires low resolution. Accordingly, the first selector 350 selects and outputs one of the constant values PE2-PEN to the digital loop filter 120 according to the output selection signal SEL, as shown in FIG. 5.

Figure 6:
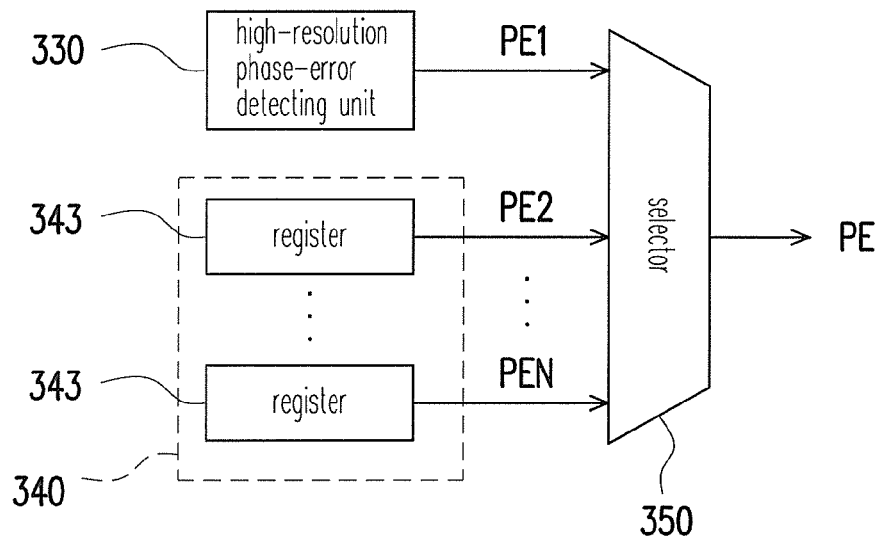
FIG. 6 illustrates another exemplary embodiment of the constant unit in FIG. 1 consistent with the present invention.

FIG. 6 illustrates another exemplary embodiment of the constant unit 340 in FIG. 1 consistent with the present invention. The constant unit 340 includes a register 343. Herein, the register 343 includes N−1 registers, wherein N is an integer larger than 1. Each of the registers 343 respectively records the different constant values PE2-PEN and provides the constant values PE2-PEN to the first selector 350.

Figure 7:
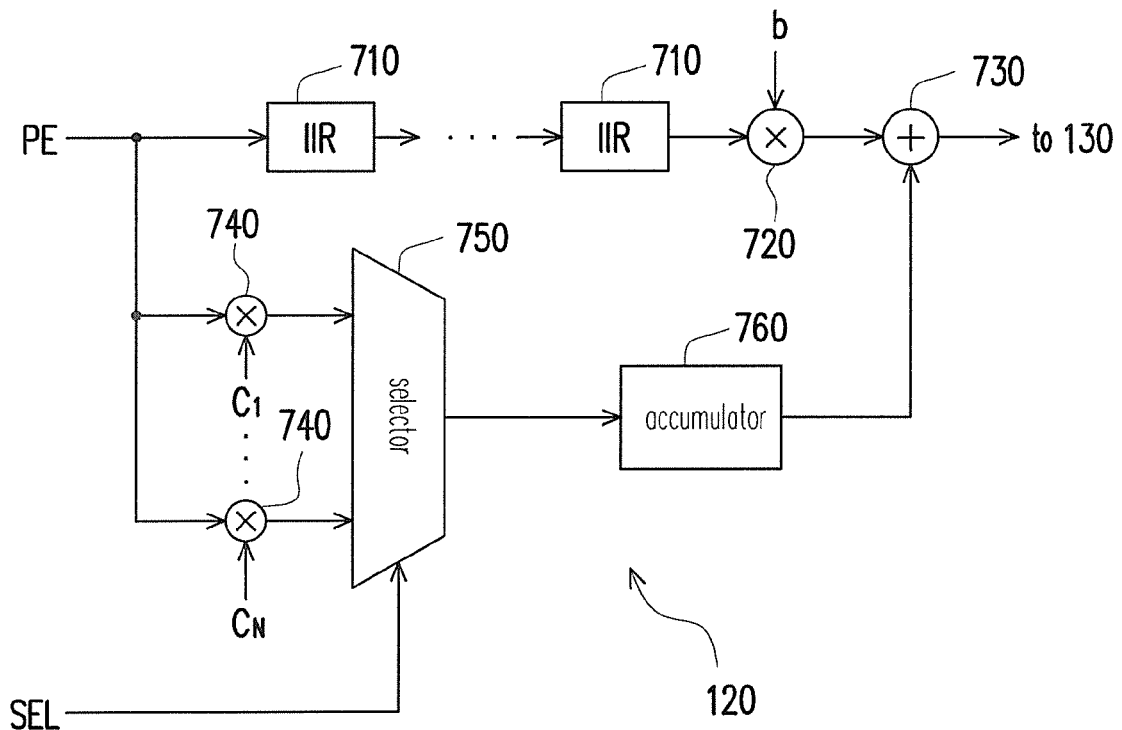
FIG. 7 illustrates an exemplary embodiment of the digital loop filter in FIG. 1 consistent with the present invention.

FIG. 7 illustrates an exemplary embodiment of the digital loop filter 120 in FIG. 1 consistent with the present invention. The digital loop filter 120 includes one or more infinite impulse response (IIR) digital loop filters 710, a second multiplier 720, one or more gain circuits 740, a second selector 750, a second accumulator 760, and an adder 730. Herein, the plurality of IIR digital loop filters 710 is adopted and forms a filter series. An input end thereof is coupled to a phase output end of the DPFD 300 to receive the phase error signal PE, and an output end of the filter series is coupled to the second multiplier 720. An input end of the second multiplier 720 receives an output of the IIR digital loop filters 710, and after multiplying data outputted by the IIR digital loop filters 710 by an adjustment parameter b, the second multiplier 720 outputs the multiplied data to the adder 730.

Herein, the plurality of gain circuits 740 is adopted. An input end of each of the gain circuits 740 is coupled to the phase output end of the DPFD 300 to receive the phase error signal PE. The gain circuits 740 respectively have different loop gains, such as $C_1$, . . . , and $C_N$ denoted in FIG. 7. A control end of the second selector 750 is coupled to a selection output end of the DPFD 300 to receive the output selection signal SEL, and an input end of the second selector 750 is coupled to output ends of the gain circuits 740. The second selector 750 selects one of outputs of the gain circuits 740 according to the output selection signal SEL and outputs that to an input end of the second accumulator 760. The input end of the second accumulator 760 is coupled to an output end of the second selector 750 to accumulate the gained phase error signals PE. A first input end of the adder 730 is coupled to an output end of the second multiplier 720; a second input end of the adder 730 is coupled to an output end of the second accumulator 760, and an output end of the adder 730 serves as the output end of the digital loop filter 120.

If the phase-error pulse width PEP is relatively large, i.e. a relatively large phase error, the second selector 750 selects the gain circuit 740 having a relatively large loop gain Ci according to the output selection signal SEL, wherein Ci represents one of the loop gains $C_1$, . . . , and $C_N$. Next, the second selector 750 transmits data outputted by the selected gain circuit 740 to the input end of the second accumulator 760. On the contrary, if the phase-error pulse width PEP is relatively small, the second selector 750 selects the gain circuit 740 having a relatively small loop gain Ci according to the output selection signal SEL. In other embodiments, the predetermined values of the loop gains $C_1$, . . . , and $C_N$ may be changed. Accordingly, it can shorten the locking time of the DPLL. By using Matlab to simulate, if the loop gains $C_1$, . . . , and $C_N$ are set as times of 1, 1.25, 1.5, 2, 4, 8, 16, and 32, the locking time of the DPLL is shorten from 125 μs (microseconds) to 40 μs.

Referring to FIG. 1, the programmable integer frequency divider 140 is controlled by the divisor switch unit 360, so as to dynamically determine the divide scale, i.e. the divisor, thereof. The feedback clock CLK in FIG. 1 severs as a divisor switch signal to control the programmable integer frequency divider 140 to have a fractional divide function. The pulse width of the feedback signal DIV in FIG. 1 is changed with the set of the divisor switch unit 360, e.g. ".f", and the mean pulse width thereof is 0.f time of the mean pulse width of the feedback clock CLK. The feedback signal DIV is provided to the DPFD 300 to control the widest pulse width of the phase error signal PE as 0.f time of the reference frequency. Any adjustable divisor frequency divider may be used to realize the programmable integer frequency divider 140. For example, in some embodiments, the programmable integer frequency divider 140 may be the programmable integer/fraction frequency divider disclosed in R.O.C. patent publication No. 200847630 and U.S. Pat. No. 7,551,707.

When the DPLL 100 is unlocked, the phase error signal PE of the DPLL 100 is processed by a low-resolution large-dynamic-range time-to-digital converter (TDC). That is, one of the constant values PE2-PEN provided by the constant unit 340 is selected and transmitted to the digital loop filter 120. When the DPLL 100 is locked, a high-resolution TDC is required to reduce in-band phase noise. Accordingly, when the DPLL 100 is locked, the phase error signal PE thereof is processed by a high-resolution small-dynamic-range TDC, so that the DPFD 300 having low power consumption, high resolution, and large dynamic range is formed.

Figure 8:
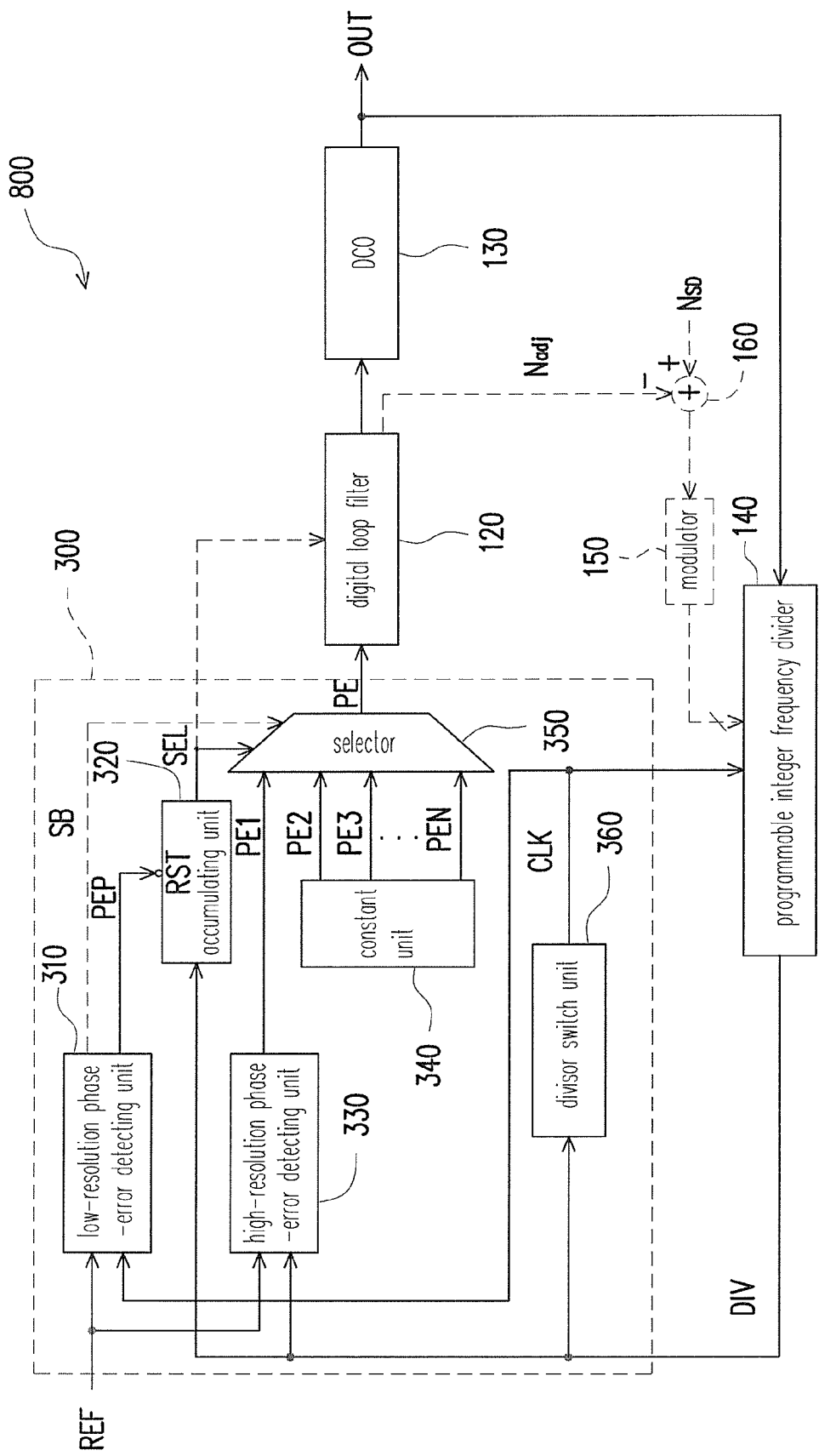
FIG. 8 is a block diagram of a DPLL according to another embodiment of the present invention.
Figure 9:
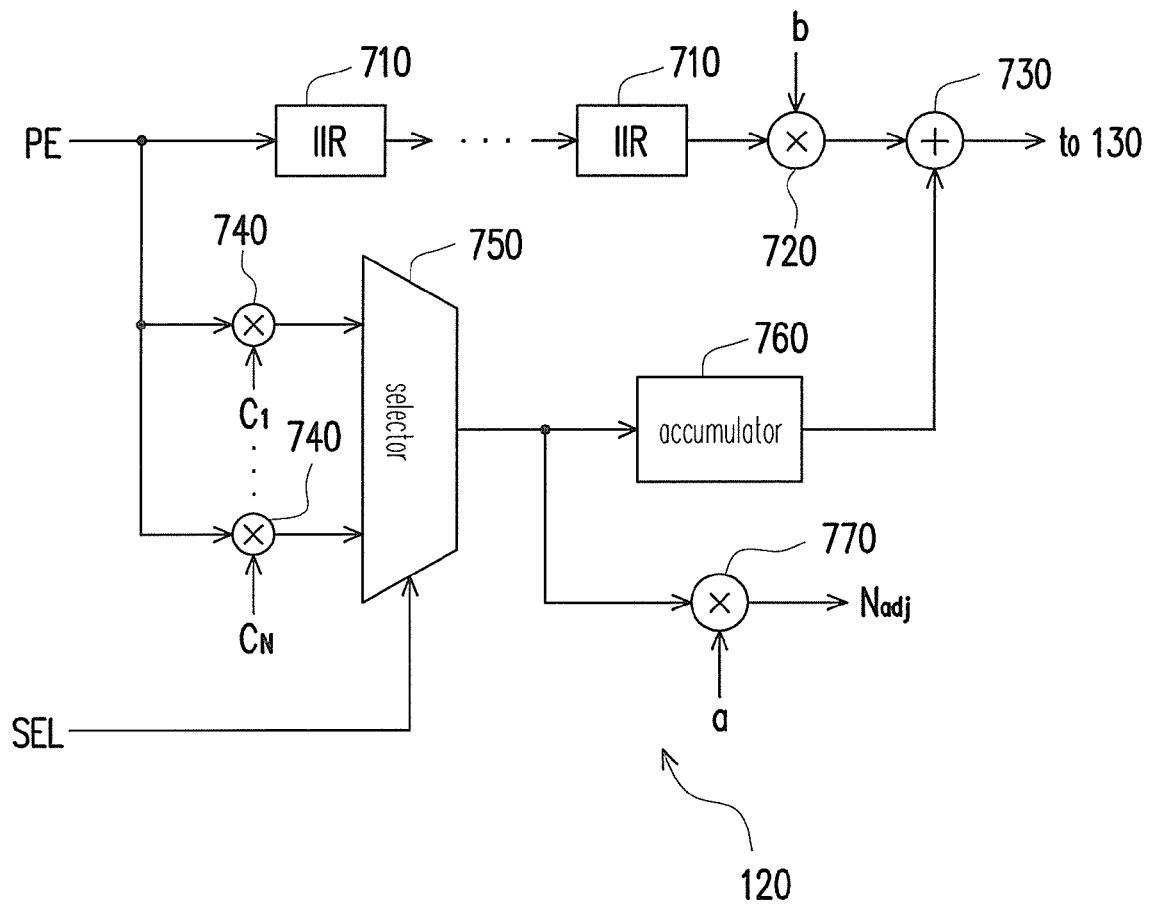
FIG. 9 illustrates another exemplary embodiment of the digital loop filter in FIG. 8 consistent with the present invention.

FIG. 8 is a block diagram of a DPLL 800 according to another embodiment of the present invention. The said DPLL 800 is substantially the same as the DPLL 100, and it will not be described any more. The differences there between are the digital loop filter 120, a modulator 150, and an adder 160. Referring to FIG. 8, in addition to transmit the gained phase error signal PE to the DCO 130, the digital loop filter 120 further generates an adjustment value Nadj to the adder 160. FIG. 9 illustrates another exemplary embodiment of the digital loop filter 120 in FIG. 8 consistent with the present invention.

Compared with the digital loop filter 120 in FIG. 7, the digital loop filter 120 in FIG. 9 further includes a third multiplier 770. Referring to FIG. 8 and FIG. 9, an input end of the third multiplier 770 receives an output of the second selector 750, and after multiplying data outputted by the second selector 750 by an adjustment parameter a, the third multiplier 770 obtains the adjustment value Nadj. The adjustment value Nadj is outputted to the adder 160. The adder 160 outputs an adjustment result to a divisor control end of the modulator 150 after adjusting a channel setting value $N_{SD}$ according to the adjustment value Nadj. Herein, the adder 160 adjusts the channel setting value $N_{SD}$ of the DPLL 800 by subtracting the adjustment value Nadj from the channel setting value $N_{SD}$. An output end of the adder 160 is coupled to an input end of the modulator 150, e.g. a sigma-delta modulator, and an output end of the modulator 150 is coupled to the divisor control end of the programmable integer frequency divider 140. The programmable integer frequency divider 140 is controlled by the divisor control end and dynamically determines the divide scale, i.e. the divisor, thereof. Similarly, by using Matlab to simulate, if the loop gains $C_1, \ldots,$ and $C_N$ are set as times of 0.5, 0.625, 0.75, 1, 2, 4, 8, and 16, and the adjustment parameter a is set as $2^{-6}$, the locking time of the DPLL 800 is shorten from 125 μs to 20 μs.

To sum up, advantages of the present embodiment are as follows.

1) When the resolution of the high-resolution TDC 334 is degraded, the reference frequency becomes lowered, and the adjustment parameter of the programmable integer frequency divider 140 may be reset, so that it satisfies the requirement of maintaining the DPLL 100 to have low phase noise.

2) When the DPLL 100 changes the channel, it is unnecessary to reset the divisor of the programmable integer frequency divider 140.

3) When the DPFD 300 respectively adopts the high-resolution small-dynamic-range TDC 334, i.e. the high-resolution phase-error detecting unit 330 and low-resolution large-dynamic-range TDC, i.e. the constant unit 340, the whole efficiency can be improved.

4) When the parameters for changing the loop bandwidth have been set, the locking time is automatically shortened.

5) The parameters for changing the loop bandwidth are changeable, so that the locking time is changed.

Although the present invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed is:

1. A digital phase-frequency detector (DPFD), comprising:
   a divisor switch unit receiving a feedback signal and removing partial pulses of the feedback signal, so as to obtain a feedback clock;
   a low-resolution phase-error detecting unit coupled to the divisor switch unit and detecting a phase error between a reference signal and the feedback clock to obtain a phase-error pulse width;
   an accumulating unit coupled to the low-resolution phase-error detecting unit and accumulating the feedback signal during the phase-error pulse width to obtain an output selection signal;
   a high-resolution phase-error detecting unit detecting the phase error between the reference signal and the feedback signal to obtain a phase-error value;
   a constant unit providing at least one constant value; and
   a selector coupled to the accumulating unit, the high-resolution phase-error detecting unit, and the constant unit, and the selector selecting and outputting one of the phase-error value and the at least one constant value according to the output selection signal.

2. The DPFD as claimed in claim 1, wherein the low-resolution phase-error detecting unit comprises:
   a first flip-flop, wherein a trigger end thereof receives the reference signal, and an input end thereof receives a first logic value;
   a second flip-flop, wherein a trigger end thereof receives the feedback clock, and an input end thereof receives the first logic value;
   a NAND gate, wherein a first input end thereof is coupled to an output end of the first flip-flop, a second input end of the NAND gate is coupled to an output end of the second flip-flop, and an output end of the NAND gate is coupled to reset ends of the first flip-flop and the second flip-flop; and
   an OR gate, wherein a first input end thereof is coupled to the output end of the first flip-flop, a second input end of the OR gate is coupled to the output end of the second flip-flop, and an output end of the OR gate provides the phase-error pulse width.

3. The DPFD as claimed in claim 2, wherein the low-resolution phase-error detecting unit further comprises:
   a third flip-flop, wherein a trigger end thereof is coupled to the output end of the first flip-flop, an input end of the third flip-flop is coupled to the output end of the second flip-flop, and an output end of the third flip-flop outputs a sign bit signal.

4. The DPFD as claimed in claim 3, wherein when the sign bit signal is at a high logic level, an output value of the selector is completed, so that the completed output value represents a negative phase-error output, and when the sign bit signal is at a low logic level, the output value of the selector is unchanged, so that the unchanged output value represents a positive phase-error output.

5. The DPFD as claimed in claim 1, wherein the accumulating unit comprises:

an accumulator, wherein a reset end thereof is coupled to the low-resolution phase-error detecting unit, and an input end of the accumulator receives the feedback signal to accumulate the feedback signal during the phase-error pulse width; and a fourth flip-flop, wherein a trigger end thereof is coupled to the low-resolution phase-error detecting unit, an input end of the fourth flip-flop is coupled to an output end of the accumulator, so that the fourth flip-flop latches an output of the accumulator when the phase-error pulse width ends, and an output end of the fourth flip-flop provides the output selection signal.

6. The DPFD as claimed in claim 1, wherein the accumulating unit comprises:

a multiple frequency circuit, wherein an input end thereof receives the feedback signal;

an accumulator, wherein a reset end thereof is coupled to the low-resolution phase-error detecting unit, and an input end of the accumulator is coupled to an output end of the multiple frequency circuit to accumulate an output of the multiple frequency circuit during the phase-error pulse width; and a fourth flip-flop, wherein a trigger end thereof is coupled to the low-resolution phase-error detecting unit, an input end of the fourth flip-flop is coupled to an output end of the accumulator, so that the fourth flip-flop latches an output of the accumulator when the phase-error pulse width ends, and an output end of the fourth flip-flop provides the output selection signal.

7. The DPFD as claimed in claim 1, wherein the high-resolution phase-error detecting unit comprises:

a fifth flip-flop, wherein a trigger end thereof receives the feedback signal, and an input end thereof receives the reference signal; and a time-to-digital converter (TDC), wherein a first input end thereof receives the reference signal, a second input end thereof is coupled to an output end of the fifth flip-flop, and an output end of the TDC provides the phase-error value.

8. The DPFD as claimed in claim 7, wherein the TDC comprises:

a timer, wherein a start end thereof receives the reference signal, a stop end thereof is coupled to the output end of the fifth flip-flop, and an output end of the timer provides the phase-error value.

9. The DPFD as claimed in claim 1, wherein the constant unit comprises at least one register recording and providing the constant value.

10. The DPFD as claimed in claim 1, wherein the constant unit comprises:

a register recording and providing a step value; and at least one multiplier coupled to the register, multiplying the step value by a multiple, and outputting the multiplied step value as the constant value.

11. A digital phase-locked loop (DPLL), comprising:

a digital phase-frequency detector (DPFD) comprising:

a divisor switch unit receiving a feedback signal and removing partial pulses of the feedback signal, so as to obtain a feedback clock;

a low-resolution phase-error detecting unit coupled to the divisor switch unit and detecting a phase error between a reference signal and the feedback clock to obtain a phase-error pulse width;

an accumulating unit coupled to the low-resolution phase-error detecting unit and accumulating the feedback signal during the phase-error pulse width to obtain an output selection signal;

a high-resolution phase-error detecting unit detecting the phase error between the reference signal and the feedback signal to obtain a phase-error value;

a constant unit providing at least one constant value; and a first selector coupled to the accumulating unit, the high-resolution phase-error detecting unit, and the constant unit, and the first selector selecting and outputting one of the phase-error value and the at least one constant value according to the output selection signal;

a digital loop filter, wherein an input end thereof receives an output of the first selector;

a digitally controlled oscillator (DCO), wherein a control end thereof is coupled to an output end of the digital loop filter, and an output end of the DCO provides a phase-locked signal; and a programmable integer frequency divider, wherein an input end thereof is coupled to the output end of the DCO, an output end of the programmable integer frequency divider provides the feedback signal, and the programmable integer frequency divider is controlled by the feedback clock, so as to dynamically determine a divide scale thereof.

12. The DPLL as claimed in claim 11, wherein the low-resolution phase-error detecting unit comprises:

a first flip-flop, wherein a trigger end thereof receives the reference signal and an input end thereof receives a first logic value;

a second flip-flop, wherein a trigger end thereof receives the feedback clock and an input end thereof receives the first logic value;

a NAND gate, wherein a first input end thereof is coupled to an output end of the first flip-flop, a second input end of the NAND gate is coupled to an output end of the second flip-flop, and an output end of the NAND gate is coupled to reset ends of the first flip-flop and the second flip-flop; and an OR gate, wherein a first input end thereof is coupled to the output end of the first flip-flop, a second input end of the OR gate is coupled to the output end of the second flip-flop, and an output end of the OR gate provides the phase-error pulse width.

13. The DPLL as claimed in claim 12, wherein the low-resolution phase-error detecting unit further comprises:

a third flip-flop, wherein a trigger end thereof is coupled to the output end of the first flip-flop, an input end of the third flip-flop is coupled to the output end of the second flip-flop, and an output end of the third flip-flop outputs a sign bit signal.

14. The DPLL as claimed in claim 13, wherein when the sign bit signal is at a high logic level, an output value of the first selector is completed, so that the completed output value represents a negative phase-error output, and when the sign bit signal is at a low logic level, the output value of the first selector is unchanged, so that the unchanged output value represents a positive phase-error output.

15. The DPLL as claimed in claim 11, wherein the accumulating unit comprises:

an first accumulator, wherein a reset end thereof is coupled to the low-resolution phase-error detecting unit, and an input end of the first accumulator is coupled to the output end of the programmable integer frequency divider to receive the feedback signal and accumulate the feedback signal during the phase-error pulse width; and a fourth flip-flop, wherein a trigger end thereof is coupled to the low-resolution phase-error detecting unit, an input end of the fourth flip-flop is coupled to an output end of the first accumulator, so that the fourth flip-flop latches an output of the first accumulator when the phase-error pulse width ends, and an output end of the fourth flip-flop provides the output selection signal.

16. The DPLL as claimed in claim 11, wherein the accumulating unit comprises:
a multiple frequency circuit, wherein an input end thereof is coupled to the output end of the programmable integer frequency divider to receive the feedback signal;
an first accumulator, wherein a reset end thereof is coupled to the low-resolution phase-error detecting unit, and an input end of the first accumulator is coupled to an output end of the multiple frequency circuit to accumulate an output of the multiple frequency circuit during the phase-error pulse width; and
a fourth flip-flop, wherein a trigger end thereof is coupled to the low-resolution phase-error detecting unit, an input end of the fourth flip-flop is coupled to an output end of the first accumulator, so that the fourth flip-flop latches an output of the first accumulator when the phase-error pulse width ends, and an output end of the fourth flip-flop provides the output selection signal.

17. The DPLL as claimed in claim 11, wherein the high-resolution phase-error detecting unit comprises:
a fifth flip-flop, wherein a trigger end thereof is coupled to the output end of the programmable integer frequency divider to receive the feedback signal, and an input end thereof receives the reference signal; and
a time-to-digital converter (TDC), wherein a first input end thereof receives the reference signal, a second input end thereof is coupled to an output end of the fifth flip-flop, and an output end of the TDC provides the phase-error value.

18. The DPLL as claimed in claim 17, wherein the TDC comprises:
a timer, wherein a start end thereof receives the reference signal, a stop end thereof is coupled to the output end of the fifth flip-flop, and an output end of the timer provides the phase-error value.

19. The DPLL as claimed in claim 11, wherein the constant unit comprises at least one register recording and providing the constant value.

20. The DPLL as claimed in claim 11, wherein the constant unit comprises:
a register recording and providing a step value; and
at least one first multiplier coupled to the register, multiplying the step value by a multiple, and outputting the multiplied step value as the constant value.

21. The DPLL as claimed in claim 11, wherein the digital loop filter comprises:
at least one infinite impulse response (IIR) digital loop filters, wherein an input end thereof is coupled to an output end of the first selector;
a second multiplier, wherein an input end thereof is coupled to an output end of the at least one IIR digital loop filter, and the second multiplier multiplies data of the input end thereof by an adjustment parameter and outputs the multiplied data;
a plurality of gain circuits, wherein input ends of the gain circuits are coupled to an output end of the first selector, and the gain circuits have different gain values;
a second selector coupled to the accumulating unit and the gain circuits, and the second selector selecting and transmitting an output of one of the gain circuits to an output end of the second selector according to the output selection signal outputted by the accumulating unit;
a second accumulator, wherein an input end thereof is coupled to the output end of the second selector; and
an adder, wherein a first input end thereof is coupled to an output end of the second multiplier, a second input end of the adder is coupled to an output end of the second accumulator, and an output end of the adder serves as the output end of the digital loop filter.

22. The DPLL as claimed in claim 11, further comprising:
an first adder coupled to the digital loop filter, wherein the digital loop filter generates an adjustment value to the first adder, and the first adder outputs an adjustment result after adjusting a channel setting value in accordance with the adjustment value; and
a modulator coupled to the first adder and the programmable integer frequency divider and dynamically controlling the divide scale of the programmable integer frequency divider according to the adjustment result.

23. The DPLL as claimed in claim 22, wherein the digital loop filter comprises:
at least one IIR digital loop filters, wherein an input end thereof is coupled to an output end of the first selector;
a second multiplier, wherein an input end thereof is coupled to an output end of the at least one IIR digital loop filter, and the second multiplier multiplies data of the input end thereof by a first adjustment parameter and outputs the multiplied data;
a plurality of gain circuits, wherein input ends of the gain circuits are coupled to an output end of the first selector, and the gain circuits have different gain values;
a second selector coupled to the accumulating unit and the gain circuits, and the second selector selecting and transmitting an output of one of the gain circuits to an output end of the second selector according to the output selection signal outputted by the accumulating unit;
a second accumulator, wherein an input end thereof is coupled to the output end of the second selector;
an second adder, wherein a first input end thereof is coupled to an output end of the second multiplier, a second input end of the second adder is coupled to an output end of the second accumulator, and an output end of the second adder serves as the output end of the digital loop filter; and
a third multiplier, wherein an input end thereof is coupled to the output end of the second selector, and the third multiplier multiplies an output of the second selector by a second adjustment parameter and outputs the adjustment value to the first adder.

* * * * *